(12) United States Patent
Zhang

(10) Patent No.: US 8,783,798 B2
(45) Date of Patent: Jul. 22, 2014

(54) CABINET FRAMEWORK AND CABINET HAVING THE CABINET FRAMEWORK

(71) Applicant: Huawei Technologies Co., Ltd., Guangdong (CN)

(72) Inventor: Shi Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/952,196

(22) Filed: Jul. 26, 2013

(65) Prior Publication Data

US 2013/0307388 A1 Nov. 21, 2013

Related U.S. Application Data

(63) Continuation of application No. PCT/CN2012/071699, filed on Feb. 28, 2012.

(51) Int. Cl.
*A47G 29/00* (2006.01)

(52) U.S. Cl.
USPC ........................................ 312/265.3; 312/111

(58) Field of Classification Search
USPC ........ 312/111, 257.1, 263, 264, 265.1–265.5; 211/26, 189
See application file for complete search history.

(56) References Cited

U.S. PATENT DOCUMENTS

| | | | | |
|---|---|---|---|---|
| 2,938,759 A | * | 5/1960 | Rudow et al. | 248/188 |
| 4,202,243 A | * | 5/1980 | Leonhardt | 411/501 |
| 4,643,319 A | | 2/1987 | Debus et al. | |
| 5,820,289 A | * | 10/1998 | Kern et al. | 403/231 |
| 6,039,420 A | | 3/2000 | Besserer et al. | |
| 6,102,498 A | | 8/2000 | Kohler et al. | |
| 6,123,400 A | | 9/2000 | Nicolai et al. | |
| 6,238,029 B1 | | 5/2001 | Marzec et al. | |
| 6,679,646 B2 | * | 1/2004 | Quardt et al. | 403/348 |
| 7,293,666 B2 | | 11/2007 | Mattlin et al. | |
| 7,718,889 B2 | | 5/2010 | Rasmussen et al. | |
| 2007/0278915 A1 | | 12/2007 | Conrardy et al. | |

FOREIGN PATENT DOCUMENTS

| | | |
|---|---|---|
| CN | 2366200 Y | 3/2000 |
| CN | 201589054 U | 9/2010 |
| CN | 201772250 U | 3/2011 |
| CN | 202058986 U | 11/2011 |
| EP | 0151478 A2 | 8/1985 |

OTHER PUBLICATIONS

International Search Report dated Dec. 6, 2012 in connection with International Patent Application No. PCT/CN2012/071699.

* cited by examiner

*Primary Examiner* — Matthew Ing

(57) ABSTRACT

A cabinet framework includes a front door frame, a rear door frame, and depth components. The front door frame consists of four first section bars connected end to end. The first section bars are connected by two-way components which includes two sockets with insertion directions perpendicular to each other. The first section bar is a rectangular hollow beam formed by folding a rectangular sheet and is connected to the two-way component by insertion at the socket. The rectangular sheet includes a first edge and a second edge connected together. The first edge wraps around the second edge to form a flange which has multiple rectangular through holes. The rectangular through holes are step holes. The diameter of the holes on the first edge is greater than that on the second edge.

9 Claims, 9 Drawing Sheets

CABINET FRAMEWORK AND CABINET HAVING THE CABINET FRAMEWORK

CROSS-REFERENCE TO RELATED APPLICATIONS

This application is a continuation of International Application No. PCT/CN2012/071699, filed on Feb. 28, 2012, which is hereby incorporated by reference in its entirety.

TECHNICAL FIELD

The present invention relates to the electric and electronic field, and in particular, to a cabinet framework and a cabinet having the cabinet framework.

BACKGROUND

For a framework-type cabinet, the compatibility, operability, and cost effectiveness of the whole cabinet system depends on the framework design. Regarding the compatibility, the front opening of the cabinet framework should be as large as possible to accommodate electronic devices of different standards; regarding the operability, the top and bottom openings of the framework should be as large and integral as possible to provide sufficient lead-in and lead-out area; and regarding the cost effectiveness, the framework should be made of fewest materials to provide as much strength and rigidity as possible. A cabinet framework is generally a welded structure and cannot be disassembled for transportation. As the ICT (Information and Communications Technologies) develops, an increasing number of empty cabinets are purchased as independent modules. However, as industrial cabinet frameworks with such a welded structure cannot be disassembled for transportation, they cannot meet this trend.

SUMMARY

The technical problem to be solved by embodiments of the present invention is to provide a cabinet framework and a cabinet having the cabinet framework, so as to provide good compatibility, operability, and cost effectiveness for the cabinet and allow the cabinet to be disassembled for transportation and remotely assembled.

An embodiment of the present invention provides a cabinet framework. The cabinet framework includes a front door frame, a rear door frame, and depth components. The front door frame and the rear door frame are arranged facing each other. The depth components are connected between the front door frame and the rear door frame. The front door frame consists of four first section bars connected end to end. The first section bars are connected by two-way components. The two-way component includes two sockets with insertion directions perpendicular to each other. The first section bar is a rectangular hollow beam formed by folding a rectangular sheet. The first section bar is connected to the two-way component by insertion at the socket. The rectangular sheet includes a first edge and a second edge connected together. The first edge wraps around the second edge to form a flange extending along an axial direction of the first section bar. The flange has multiple rectangular through holes arranged along the first section bar. The rectangular through holes are step holes. The diameter of the rectangular through holes on the first edge is greater than the diameter of the rectangular through holes on the second edge. The front door frame and the rear door frame have the same structure.

A cabinet, including a top plate, side walls, a bottom plate, and the preceding cabinet framework, is also provided. The top plate and the bottom plate cover oppositely the top and bottom of the cabinet framework. The side walls surround the top plate and the bottom plate, and are fixed around the cabinet framework.

In the embodiments of the present invention, the cabinet framework is formed by connecting section bars together, so it can be easily disassembled and transported; the first section bars formed by the rectangular hollow beams are light and provide strong support; and the two edges of the first section bar are connected by wrapping, so they can be directly folded without welding so that a welding process is not needed. In addition, the step-like rectangular through hole formed on the flange of the first section bar can accommodate the space occupied by a raised edge of a floating nut.

BRIEF DESCRIPTION OF THE DRAWINGS

To illustrate the technical solutions in the embodiments of the present invention or in the prior art more clearly, the following briefly describes the accompanying drawings required for describing the embodiments or the prior art. Apparently, the accompanying drawings in the following descriptions merely show some embodiments of the present invention, and persons of ordinary skill in the art can derive other drawings from the accompanying drawings without creative efforts.

DETAILED DESCRIPTION

The following clearly and completely describes the technical solutions according to the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

In the embodiments of the present invention, the cabinet framework is formed by connecting section bars together, so it can be easily disassembled and transported.

Figure 1:
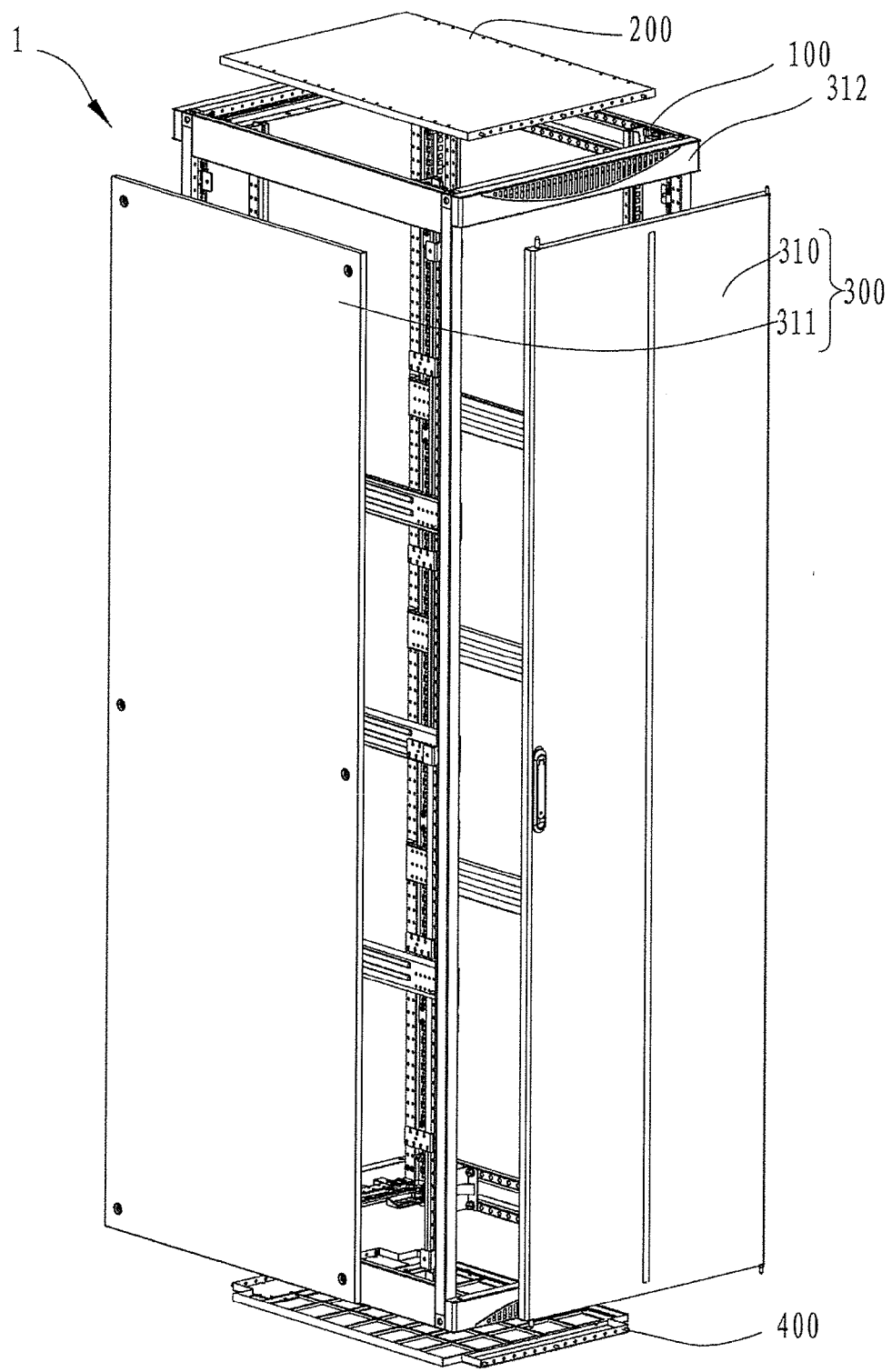
FIG. 1 is a schematic diagram of a cabinet according to the present invention.
Figure 2:
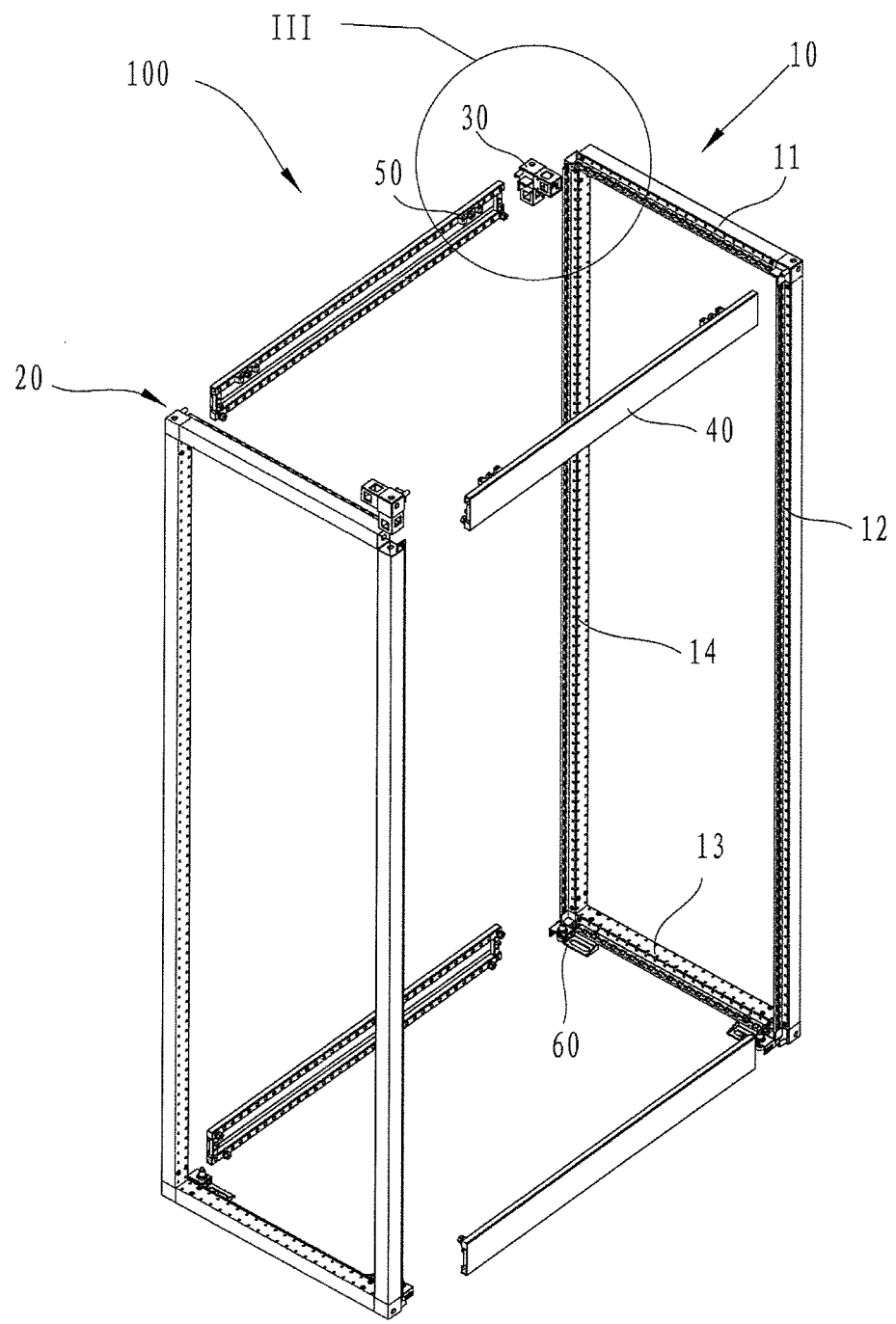
FIG. 2 is a schematic diagram of a cabinet framework according to the present invention.
Figure 3:
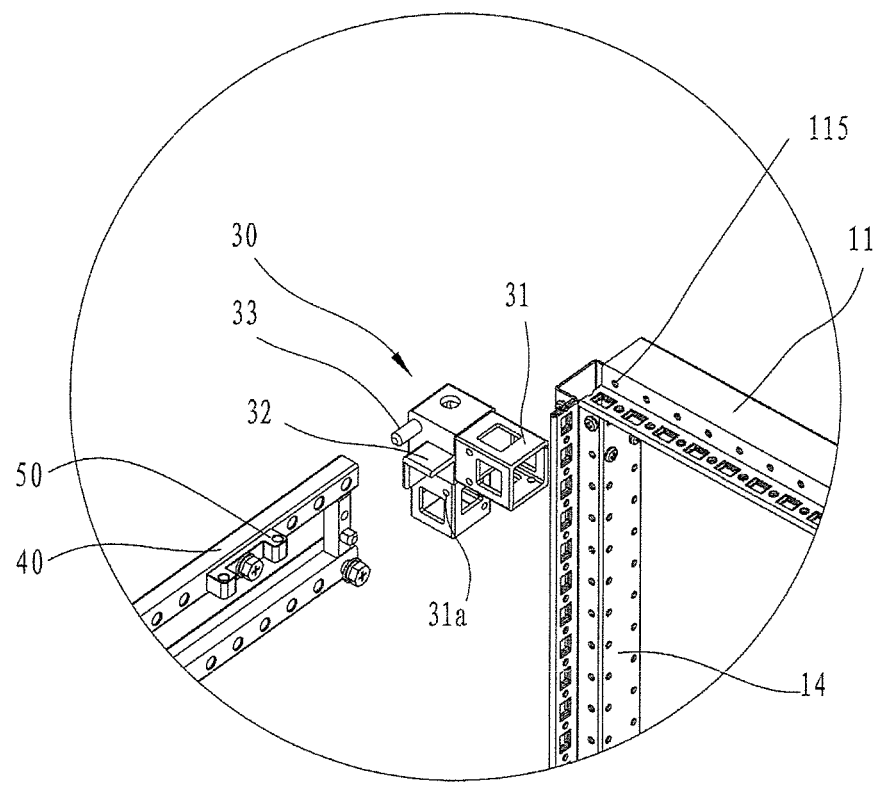
FIG. 3 is a partial enlarged diagram of the cabinet framework in FIG. 2.

Referring to FIG. 1 to FIG. 3, a cabinet 1 according to a first embodiment of the present invention is illustrated. The cabinet 1 includes a cabinet framework 100, a top plate 200, side walls 300, and a bottom plate 400. The cabinet framework 100 is rectangular. The top plate 200 and the bottom plate 400 cover oppositely the top and bottom of the cabinet framework 100. The side walls 300 include a front door 310, a rear door (not shown), a left side plate 311, and a right side plate (not shown), where the front door 310 and the rear door cover oppositely the front and the rear of the cabinet framework 100. The left side plate 311 and the right side plate cover oppositely the left side and the right side of the cabinet framework 100. The top plate 200, the left side plate 311, the right side plate, and the bottom plate 400 are fixed onto the cabinet framework 100 by using screws; and the front door 310 and the rear door are locked onto the cabinet framework 100 through upper and lower door heads 312 installed on the framework. Certainly, in other embodiments, the top plate 200, the left side plate 311, the right side plate, and the bottom plate 400 may also be fixed by welding, riveting or other manners. The front door 310 and the rear door may also be designed as side plates.

The cabinet framework 100 includes a front door frame 10, a rear door frame 20, a two-way component 30, a depth component 40, a cabinet combining connector 50, and a ground fixing piece 60.

The front door frame 10 and the rear door frame 20 are arranged oppositely, and the depth components 40 are connected between the front door frame 10 and the rear door frame 20. In this embodiment, the rear door frame 20 has the same structure with the front door frame 10. The front door frame 10 is rectangular. The front door frame 10 consists of four first section bars 11, 12, 13, and 14 which have the same section and are connected end to end. The first section bars 11, 12, 13, and 14 are steel sections. The first section bars 11 and 13 are of the same length and parallel to each other, and the first section bars 12 and 14 are of the same length and parallel to each other. The first section bars 11 and 13 are shorter than the first section bars 12 and 14. Certainly, in other embodiments, the length of the first section bars 11, 12, 13, and 14 can be processed to be different values as required, and the first section bars 11, 12, 13, and 14 can be folded and deformed as required.

Figure 4:
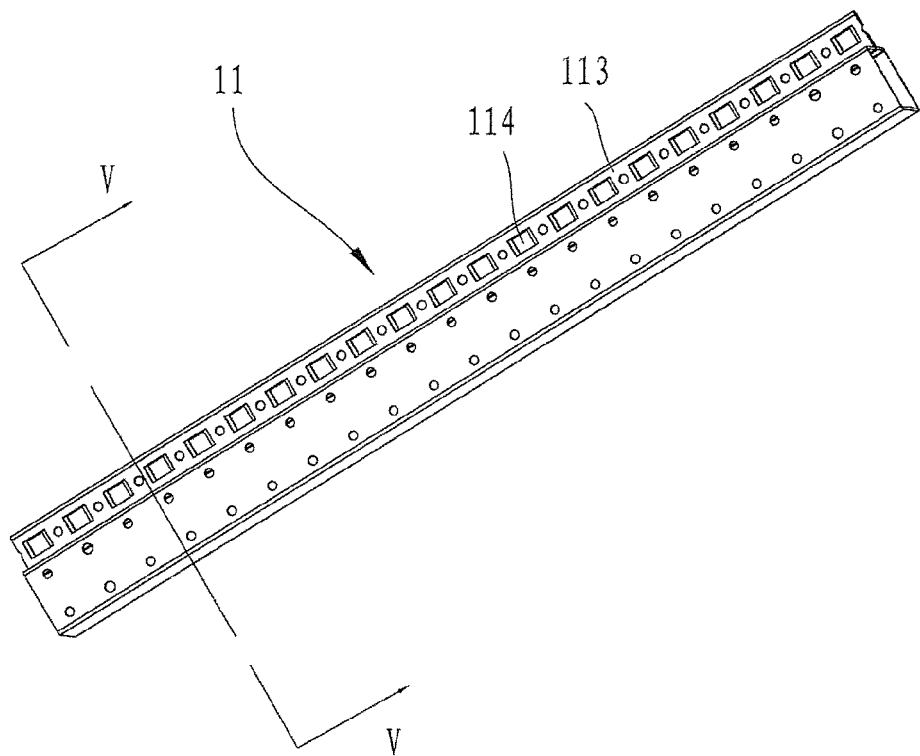
FIG. 4 is a schematic diagram of a first section bar of the cabinet framework in FIG. 2.
Figure 5:
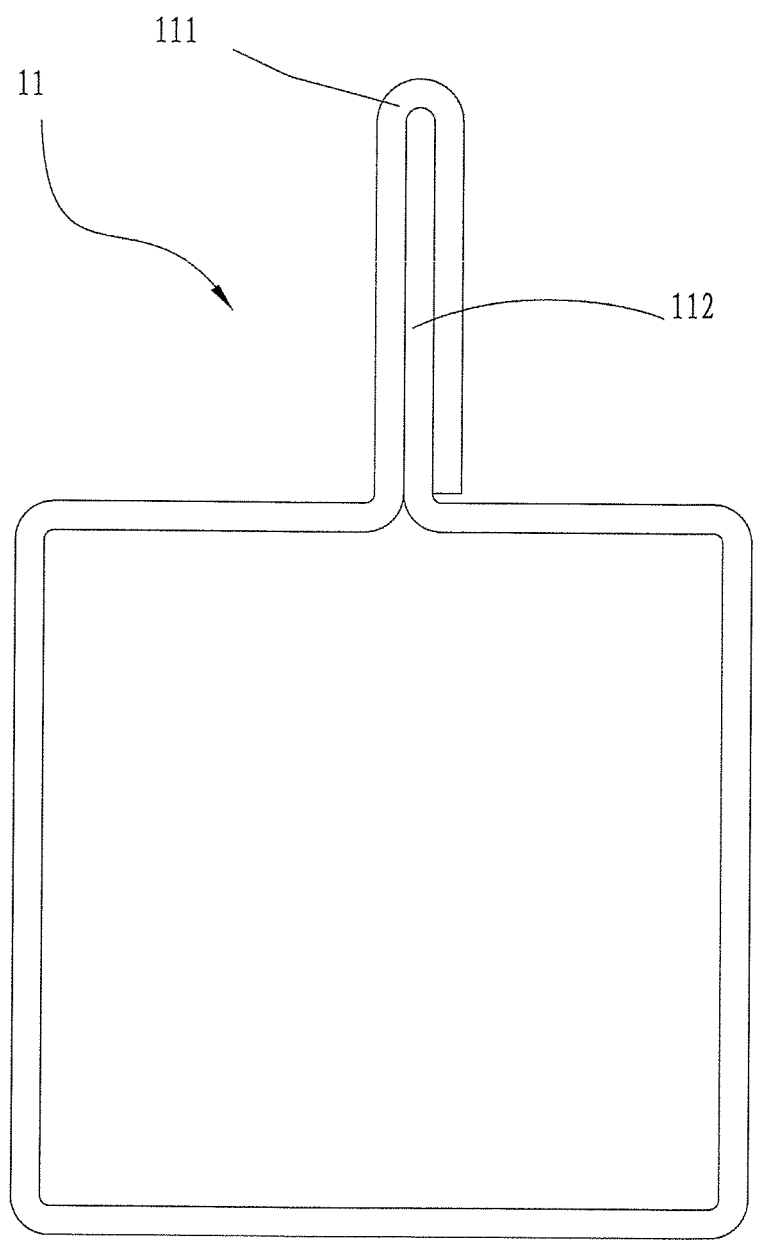
FIG. 5 is a schematic sectional diagram of the first section bar of the cabinet framework in FIG. 4.
Figure 6:
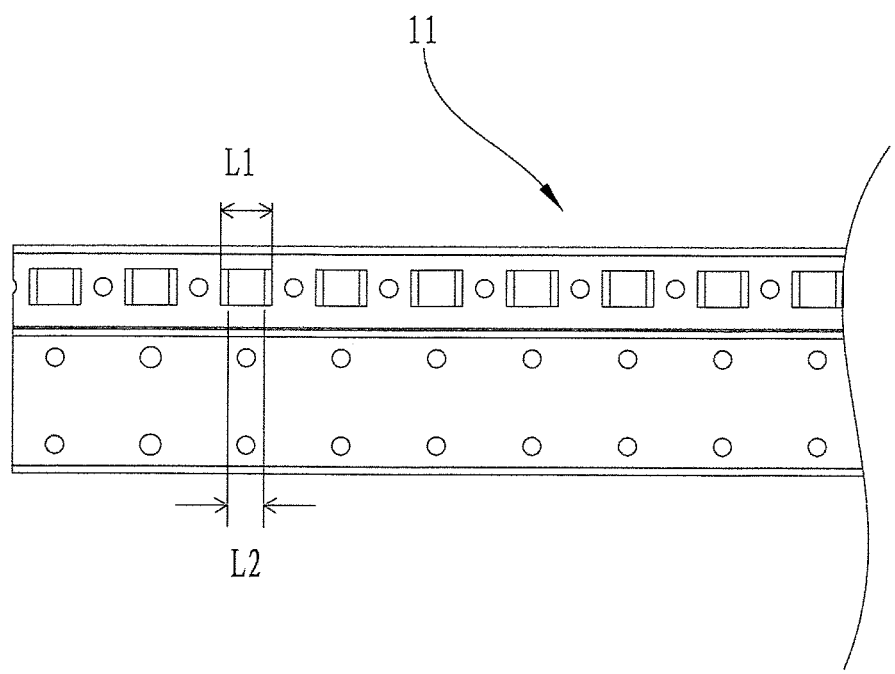
FIG. 6 is a schematic diagram of the first section bar of the cabinet framework in FIG. 2 from another perspective.

Referring to FIG. 4 to FIG. 6, the first section bar 11 is taken as an example. The first section bar 11 is a rectangular hollow beam formed by folding a rectangular sheet 110, where the rectangular sheet 110 includes a first edge 111 and a second edge 112 connected together. The first edge 111 wraps around the second edge 112 to form a flange 113 extending along an axial direction of the first section bar 11, and multiple rectangular through holes 114 allocated along the axial direction of the first section bar 11 are formed on the flange 113. The rectangular through holes 114 are step holes arranged with equal intervals, and the interval between the rectangular through holes is 25 mm. The diameter of the rectangular through holes 114 on the first edge 111 is greater than the diameter of the rectangular through holes 114 on the second edge 112, and the rectangular through holes 114 are configured to install floating nuts. The length L1 of the rectangular hole part of the rectangular through holes 114 on the first edge 111 along the axial direction of the first section bar 11 is greater than the length L2 of the rectangular hole part of the rectangular through holes 114 on the second edge 112 along the axial direction of the first section bar 11. The rectangular through holes 114 on the first edge 111 are rectangular holes of 9.5 mm×13.5 mm. The rectangular through holes 114 on the second edge 112 are rectangular holes of 9.5 mm×9.5 mm, so as to accommodate the space occupied by raised edges of the floating nuts. Screw holes (not shown) are arranged between the rectangular through holes 114. Certainly, in other embodiments, the rectangular through holes 114 can be round or of other shapes. The depth component 40 may further be directly fixed onto the first section bar 11 by using screws, in which case the flange 113 is not required. Screw holes 115 for connecting the two-way components 30 and other components are arranged with equal intervals on the first section bars 11.

The first section bars 11 are connected by the two-way components 30. The two-way component 30 includes two sockets 31 and one corner flange 32, and the sockets 31 and the first section bars 11 are mutually inserted. In this embodiment, insertion directions of the two sockets 31 of the two-way component 30 are perpendicular to each other, and the first section bar 11 is sleeved onto the socket 31 of the two-way component 30. Screw holes 31a that correspond to the screw holes 114 at an end portion of the first section bar 11 are arranged on the socket 31, and the first section bar 11 is fixed onto the two-way component 30 by using screws. The corner flange 32 is positioned between the flanges 113 of the two first section bars 11 on the two-way component 30, and is configured to connect the flanges 113 of the two first section bars 11. The flanges 113 of the two first section bars 11 can be integrated by welding the corner flange 32 and the flanges 113 of the two first section bars 11, thereby improving the strength of the framework formed by the first section bars 11. The corner flange 32 is further configured to form a complete ring-shaped edge together with the flanges 113, so as to facilitate the sealing of the cabinet 1. A positioning cylinder 33 is fixed at the joint of the two sockets 31 on the two-way component 30, where the positioning cylinder 33 is configured to fix and position the depth component 40.

Figure 7:
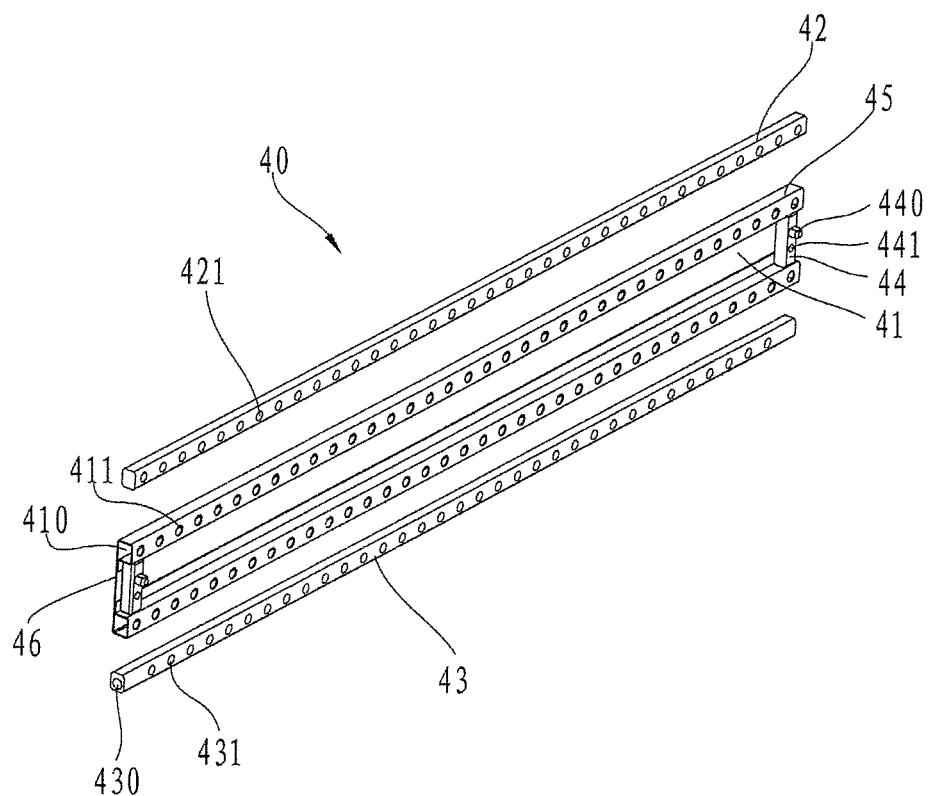
FIG. 7 is a schematic diagram of a depth component of the cabinet framework in FIG. 2.

Referring to FIG. 7, the depth component 40 includes a bottom plate 41, two reinforcing columns 42 and 43, and two supporting pieces 44. A first end 45 and a second end 46 of the depth component 40 arranged oppositely are respectively connected to the two corresponding two-way components 30 on the front door frame 10 and the rear door frame 20. In this embodiment, the first end 45 and the second end 46 are respectively connected to the positioning cylinders 33 on the two corresponding two-way components 30 of the front door frame 10 and the rear door frame 20.

The bottom plate 41 is rectangular. The two sides of the bottom plate 41 that extend along a longitudinal direction include two accommodating cavities 410 extending along the longitudinal direction. In this embodiment, the accommodating cavities 410 are formed by folding the bottom plate 41. The accommodating cavities 410 are configured to improve the strength of the bottom plate 41. The two reinforcing columns 42 and 43 are respectively accommodated in the two accommodating cavities 410 along the longitudinal direction of the bottom plate 41, where a pin hole 430 working with the positioning cylinder 33 is respectively arranged at the two ends of the reinforcing column 43. The two reinforcing columns 42 and 43 are configured to further improve the strength of the bottom plate 41. Nut strips are used as the reinforcing columns 42 and 43, and multiple screw holes 421 and 431 are arranged with an interval of 25 mm along the longitudinal direction of the bottom plate 41 on one side of the reinforcing columns 42 and 43 that is far away from the bottom plate 41 respectively, so as to reserve multiple installation positions, thereby facilitating the installation of various parts on the depth component 40; in this way, the cabinet combining connector 5 can be installed at any position of the bottom plate 41; and multiple through holes 411 corresponding to the screw holes 421 and 431 are arranged in the accommodating cavities 410 to expose the screw holes 421 and 431. The two supporting pieces 44 are respectively arranged at the first end 45 and the second end 46 of the bottom plate 41 along the longitudinal direction; and the supporting pieces 44 are clamped between the two accommodating cavities 410 and are configured to support the side walls of the two accommodating cavities 410, so as to form an enclosed framework structure, thereby improving the strength of the depth component 40. One trimming positioning pin 440 and one screw hole 441 are arranged on one side of the supporting piece 44 that is far away from the bottom plate 41. The trimming positioning pin 440 is inserted in the rectangular through hole 114, and the screw hole 441 is connected to the corresponding rectangular through hole 114 on the flange 113 by using a screw.

Figure 8:
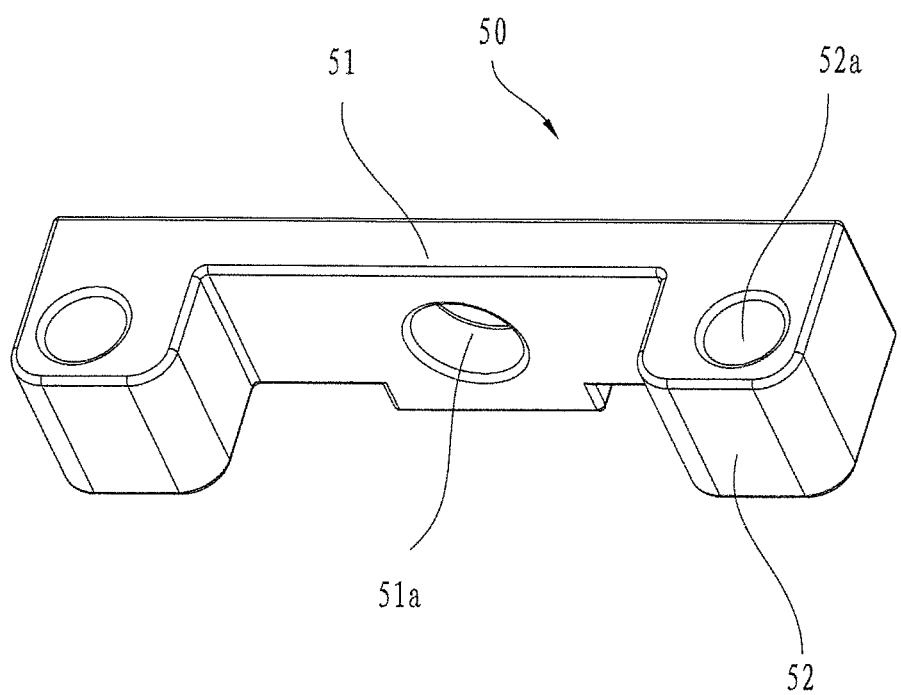
FIG. 8 is a schematic diagram of a cabinet combining connector of the cabinet framework in FIG. 2.

Referring to FIG. 8, the cabinet combining connector 50 is fixed on the top of the cabinet framework 100 and is connected to a connecting plate (not shown), and the connecting plate is connected to two cabinet frameworks 100. When multiple cabinets 1 need to be placed side by side, the two ends of the connecting plate are respectively fixed to the adjacent edges on the top of two neighboring cabinets 1 so as to connect the multiple cabinets 1 together, thereby providing an excellent and stable operating environment for devices in the cabinets, presenting a tidy and pleasant appearance after the side-by-side arrangement of the cabinets, and allowing for centralized management. The cabinet combining connector 50 is concave. The cabinet combining connector 50 includes a connecting portion 51 and folding portions 52 at the two ends of the connecting portion 51. The connecting portion 51 is connected to the reinforcing column 42 or 43 of the depth component 40 by using screws, and the folding portion 52 is connected to the connecting plate by using screws. In this embodiment, a through hole 51a is arranged on the connecting portion 51, and a screw hole 52a is arranged on the folding portion 52. The through hole 51a is aligned with the screw hole 421 or 431, and the cabinet combining connector 50 is fixed onto the depth component 40 by using screws. The connecting plate is fixed onto the depth component 40 through screws and the screw holes 52a. The two cabinet frameworks 100 can be connected side by side through the cabinet combining connector 50.

Figure 9:
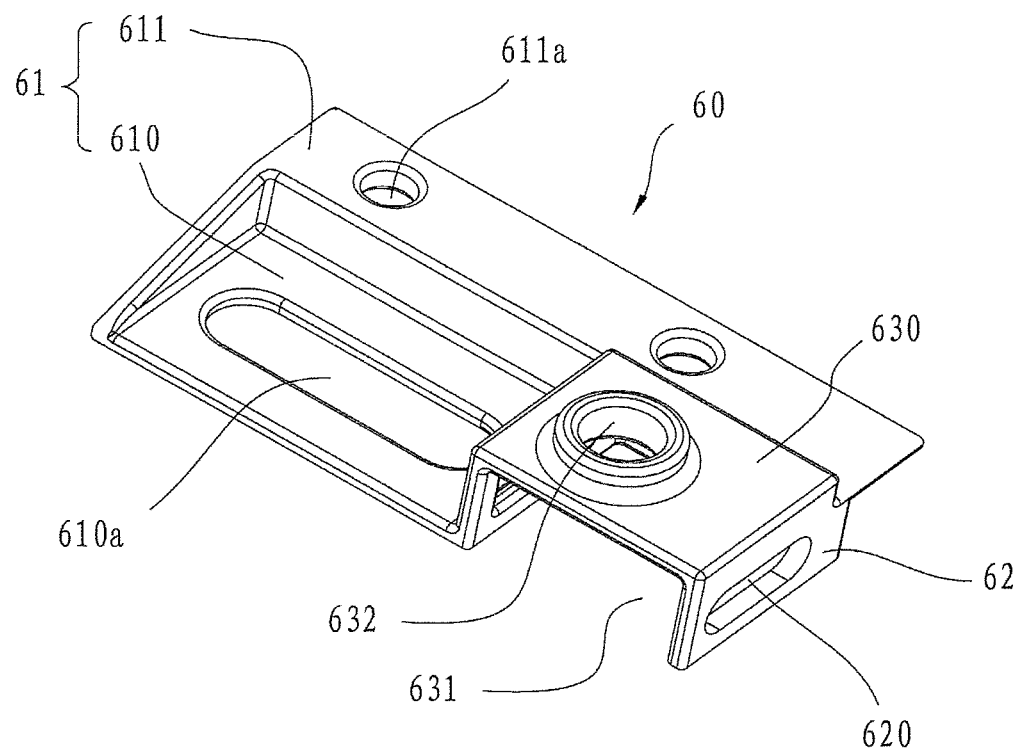
FIG. 9 is a schematic diagram of a ground fixing connector of the cabinet framework in FIG. 2.

Referring to FIG. 9, the ground fixing piece 60 is fixed at the bottom of the cabinet framework 100 and is grounded. In this embodiment, the ground fixing piece 60 is connected to the corner of the depth component 40 and the first section bar 11; the ground fixing piece 60 is plate-shaped; and the ground fixing plate 60 includes a step portion 61 and a lateral connecting portion 62. The step portion 61 includes a first step surface 610 and a second step surface 611 that are parallel to each other. A waist hole 610a is arranged on the first step surface 610; and the ground fixing piece 60 is fixed onto the ground by using a screw penetrating through the waist hole 610a. The waist hole 610a can properly adjust the position of the screw. Two screw holes 611a corresponding to the two rectangular through holes 114 at one end of the first section bar 11 are arranged on the second step surface 611. The ground fixing piece 60 is fixed to the first section bar 11 by using screws penetrating through the screw holes 611a. The lateral connecting portion 62 is perpendicularly fixed at one end of the first step surface 610 and the second step surface 611. A folding portion 630 is connected between the lateral connecting portion 62 and the first step surface 610, where the folding portion 630 and the connecting portion 62 form a cavity 631. Waist holes 620 corresponding to the two screw holes 421 or 431 at one end of the depth component 40 are arranged on the lateral connecting portion 62. The ground fixing piece 60 is fixed to the depth component 40 by using screws penetrating through the waist holes 620. One M12 threaded through hole 632 is arranged on the folding portion 630, and a leveling foot is installed on the threaded through hole 632 for level adjustment when the cabinet 1 is installed on uneven ground.

During installation of the cabinet framework 100, first, the front door frame 10 and the rear door frame 20 are assembled. For both the front door frame 10 and the rear door frame 20, the four first section bars 11, 12, 13, and 14 are sleeved onto the sockets 31 of the two-way components 30 and tightened by using screws. Then, the front door frame 10 and the rear door frame 20 are connected by the four depth components 40. The pin hole 420 on the end portion of the depth component 40 is sleeved onto the positioning cylinder 33 of the two-way component 30, and then the trimming positioning pin 440 of the depth component 40 is inserted in one of the rectangular through holes 114 on the first section bar 11, and one screw penetrating through another one of the rectangular through holes 114 of the first section bar 11 is tightened in the screw hole 441 on the supporting piece 44 of the depth component 40. More depth components 40 may be added between the front door frame 10 and the rear door frame 20 to improve the strength and facilitate the installation of other parts. Finally, the top plate 200 is fixed onto the top of the cabinet framework 100 by using screws, the bottom plate 400 is fixed at the bottom of the cabinet framework 100, the left side plate 311 and the right side plate are respectively fixed on the left side and the right side of the cabinet framework 100, and the front door 310 and the rear door are respectively installed on the front side and the rear side of the cabinet framework 100.

In the embodiments of the present invention, the cabinet framework is formed by connecting section bars together, so it can be easily disassembled and transported.

Further, as the cabinet framework consists of only two types of section bars of different length, it can be easily processed.

Further, the first section bars formed by the rectangular hollow beams are light and provide strong support.

The two edges of the first section bar are connected by wrapping, so they can be directly folded without welding so that a welding process is not needed.

The step-like rectangular through hole formed on the flange of the first section bar can accommodate the space occupied by a raised edge of a floating nut.

The corner flange of the two-way component can reserve space for the welding of the flanges of the two first section bars and form a complete ring-shaped edge together with the flanges, thereby facilitating the sealing of the cabinet.

The accommodating cavities and the reinforcing columns on the depth component can improve the strength of the bottom plate. The reinforcing columns support the side walls of the two accommodating cavities so as to form an enclosed framework to improve the strength of the depth component.

The cabinet combining connector provides a fixing interface for connecting two cabinet frameworks.

The waist hole on the ground fixing piece is configured for position adjustment during the fixing of the cabinet framework, thereby facilitating the fixing of the cabinet framework. The threaded holes on the ground fixing piece is configured to install leveling feet so as to ensure that the cabinet is horizontally installed on the ground.

Finally, it should be noted that the foregoing embodiments of the present invention are intended for describing the technical solutions of the present invention other than limiting the present invention. Although the present invention is described in detail with reference to the foregoing embodiments, persons of ordinary skill in the art should understand that they can still make modifications to the technical solutions described in the foregoing embodiments, or make equivalent substitutions to some technical features thereof, without departing from the spirit and scope of the technical solutions of the embodiments of the present invention.

What is claimed is:

1. A cabinet framework, comprising:
a front door frame;
a rear door frame;
depth components;
wherein the front door frame and the rear door frame are arranged oppositely;
the depth components are connected between the front door frame and the rear door frame;
the front door frame comprises four first section bars connected end to end, and the first section bars are connected by two-way components comprising two sockets with insertion directions perpendicular to each other;
the first section bar comprises a rectangular hollow beam formed by folding a rectangular sheet and is connected to the two-way component by insertion at the socket
the rectangular sheet comprises a first edge and a second edge connected together, the first edge wraps around the second edge to form a flange comprising two outer layers and an inner layer and extending along an axial direction of the first section bar, and the flange has multiple rectangular through holes arranged along the first section bar, with the rectangular through holes comprising step holes;
the diameter of the rectangular through holes on the two outer layers is greater than the diameter of the rectangular through holes on the inner layer; and
the front door frame and the rear door frame have the same structure.

2. The cabinet framework according to claim 1, wherein the first section bars are steel sections.

3. The cabinet framework according to claim 1, wherein the first section bars are sleeved onto the sockets of the two-way components.

4. The cabinet framework according to claim 1, wherein the depth component comprise a first end and a second end arranged oppositely; the first end and the second end are respectively connected to the two corresponding two-way components on the front door frame and the rear door frame; and the first end and the second end are connected to the two-way components through trimming positioning pins.

5. The cabinet framework according to claim 1, wherein a corner flange is arranged on the two-way component; and the corner flange is positioned between the flanges of the two first section bars that are inserted to the two-way component through the sockets and is configured to connect the flanges of the two first section bars.

6. The cabinet framework according to claim 1, further comprising a ground fixing piece, wherein the ground fixing piece is connected to the joint of the depth component and the first section bar, and is configured to fix the cabinet framework to the ground.

7. A cabinet framework, comprising:
a front door frame;
a rear door frame;
depth components;
wherein the front door frame and the rear door frame are arranged oppositely;
the depth components are connected between the front door frame and the rear door frame;
the front door frame comprises four first section bars connected end to end, and the first section bars are connected by two-way components comprising two sockets with insertion directions perpendicular to each other;
the first section bar comprises a rectangular hollow beam formed by folding a rectangular sheet and is connected to the two-way component by insertion at the socket
the rectangular sheet comprises a first edge and a second edge connected together, the first edge wraps around the second edge to form a flange extending along an axial direction of the first section bar, and the flange has multiple rectangular through holes arranged along the first section bar, with the rectangular through holes comprising step holes;
the diameter of the rectangular through holes on the first edge is greater than the diameter of the rectangular through holes on the second edge;
the front door frame and the rear door frame have the same structure; and
wherein the depth component comprises one bottom plate, two reinforcing columns, and two supporting pieces; the bottom plate is rectangular; the two sides of the bottom plate that extend along a longitudinal direction comprise two accommodating cavities that extend along the longitudinal direction; the two reinforcing columns are respectively accommodated in the two accommodating cavities along the longitudinal direction of the bottom plate; pin holes are respectively arranged at the two ends of one of the reinforcing columns; a positioning cylinder working with the pin hole is fixed on the two-way component; the two supporting pieces are respectively arranged at the two ends of the bottom plate along the longitudinal direction; the supporting pieces are clamped between the two accommodating cavities; one trimming positioning pin and one screw hole are arranged on one side of the supporting piece that is far from the bottom plate; the trimming positioning pin is inserted in the rectangular through hole; and the screw hole is connected to the corresponding rectangular through hole on the flange by using a screw.

8. The cabinet framework according to claim 7, wherein multiple screw holes are arranged with equal intervals along the longitudinal direction of the bottom plate on one side of the reinforcing column that is far away from the bottom plate, so as to reserve multiple installation positions; and multiple through holes corresponding to the screw holes of the reinforcing columns are arranged in the accommodating cavities to expose the screw holes.

9. A cabinet, comprising:
a top plate;
side walls;
a bottom plate;
a cabinet framework comprising:
a front door frame,
a rear door frame,
depth components,
wherein the front door frame and the rear door frame are arranged oppositely,
the depth components are connected between the front door frame and the rear door frame,
the front door frame comprises four first section bars connected end to end, and the first section bars are connected by two-way components comprising two sockets with insertion directions perpendicular to each other;
the first section bar is a rectangular hollow beam formed by folding a rectangular sheet and is connected to the two-way component by insertion at the socket;
the rectangular sheet comprises a first edge and a second edge connected together, the first edge wraps around the second edge to form a flange comprising two outer layers and an inner layer and extending along an axial direction of the first section bar, and the flange has multiple rectangular through holes arranged along the first section bar, with the rectangular through holes comprising step holes, the diameter of the rectangular through holes on the two outer layers is greater than the diameter of the rectangular through holes on the inner layer, and the front door frame and the rear door frame have the same structure; and wherein the top plate and the bottom plate cover oppositely the top and bottom of the cabinet framework; and the side walls surround the top plate and the bottom plate, and are fixed around the cabinet framework.

* * * * *